(12) United States Patent
Kalberer et al.

(10) Patent No.: US 10,333,515 B2
(45) Date of Patent: Jun. 25, 2019

(54) CONTROL DEVICE, AUTOMATION SYSTEM AND METHOD FOR OPERATING A CONTROL DEVICE

(71) Applicant: FESTO AG & Co. KG, Esslingen (DE)

(72) Inventors: Roland Kalberer, Kirchheim (DE); Andreas Herzog, Weinstadt (DE)

(73) Assignee: FESTO AG & Co. KG, Esslingen (DE)

( * ) Notice: Subject to any disclaimer, the term of this patent is extended or adjusted under 35 U.S.C. 154(b) by 0 days.

(21) Appl. No.: 15/882,398

(22) Filed: Jan. 29, 2018

(65) Prior Publication Data

US 2018/0219548 A1 Aug. 2, 2018

(30) Foreign Application Priority Data

Feb. 1, 2017 (DE) .................. 10 2017 201 579

(51) Int. Cl.
| | |
|---|---|
| *H03K 17/66* | (2006.01) |
| *H03K 17/687* | (2006.01) |
| *G05B 19/05* | (2006.01) |
| *H01L 29/06* | (2006.01) |
| *G01R 19/145* | (2006.01) |

(52) U.S. Cl.
CPC ......... *H03K 17/687* (2013.01); *G01R 19/145* (2013.01); *G05B 19/058* (2013.01); *H01L 29/0638* (2013.01)

(58) Field of Classification Search
CPC .. H03K 17/687; G01R 19/145; G05B 19/058; H01L 29/0638
USPC ........................................... 327/389
See application file for complete search history.

(56) References Cited

U.S. PATENT DOCUMENTS

| | | | | |
|---|---|---|---|---|
| 8,295,022 | B2 * | 10/2012 | Tang | H03K 17/0822 361/93.7 |
| 9,742,400 | B2 * | 8/2017 | Bakalski | H03K 17/693 |
| 2015/0210232 | A1 * | 7/2015 | Kanzaki | B60R 16/033 701/36 |

FOREIGN PATENT DOCUMENTS

| | | |
|---|---|---|
| DE | 102012214774 | 2/2014 |
| DE | 102015110467 | 1/2016 |
| EP | 2149826 | 2/2010 |

* cited by examiner

*Primary Examiner* — Dinh T Le
(74) *Attorney, Agent, or Firm* — Hoffmann & Baron, LLP

(57) ABSTRACT

Control device having at least one electrical switching device, configured to provide electrical power to an associated load and arranged between a supply connection and a load connection and having at least one processing device, electrically connected with an input interface, with the at least one electrical switching device and with the load connection wherein it is provided that between the supply connection and the load connection parallel to the switching device an electrical resistor means is arranged, in order that when the switching device is open it forms a voltage divider with the load and allows a monitoring of the load connection independently of the switching state of the switching device.

11 Claims, 4 Drawing Sheets

CONTROL DEVICE, AUTOMATION SYSTEM AND METHOD FOR OPERATING A CONTROL DEVICE

BACKGROUND OF THE INVENTION

The invention relates to a control device having at least one electrical switching device, configured to provide electrical power to an associated load and arranged between a supply connection and a load connection and which is configured for an opening or closing of an electrical connection between the supply connection and the load connection as a function of switching signals of at least one processing device, having at least one processing device, electrically connected with an input interface, with the at least one electrical switching device and with the load connection and which is configured to process electrical signals of the input interface, to provide switching signals to the switching device and to monitor signal levels at the load connection. The invention further relates to an automation system and a method for operating a control device.

SUMMARY OF THE INVENTION

The object of the invention is to provide a control device, an automation system and a method for operating a control device, with which an improved monitoring of loads, connected with the control device is enabled.

This object is achieved according to a first aspect of the invention for a control device having at least one electrical switching device, configured to provide electrical power to an associated load and arranged between a supply connection and a load connection and which is configured for an opening or closing of an electrical connection between the supply connection and the load connection as a function of switching signals of at least one processing device, having at least one processing device, electrically connected with an input interface, with the at least one electrical switching device and with the load connection and which is configured to process electrical signals of the input interface, to provide switching signals to the switching device and to monitor signal levels at the load connection, wherein between the supply connection and the load connection parallel to the switching device an electrical resistor means is arranged, in order that when the switching device is open it forms a voltage divider with the load and allows a monitoring of the load connection independently of the switching state of the switching device.

The electrical resistance of the electrical resistor means is selected in such a way that a current flow across the resistor means is reliably insufficient, with the switching device open and therefore not conducting, to move the connected load from a passive state to an active state and/or to maintain an active state of the load following the opening of the switching device. Rather, the electrical resistor means is dimensioned in such a way that only a very low current flow from the supply connection to the load connection and from there to the load is enabled. Thus, even with the switching device open, at the load connection a defined electrical voltage is present, which is given by the supply voltage and the ratio of the resistances of the resistor means and the load. Accordingly, the resistor means and the load form a voltage divider, wherein a tapping of an electrical voltage for diagnostics purposes at a nodal point between resistor means and load can be provided for.

The resistor means can typically be considered high-impedance, in particular with an ohmic resistance of more than 50,000 Ohms, while the load can be considered as low-impedance, in particular with an ohmic resistance of less than 5,000 Ohms. If the output side of the load, by way of example, is connected with an earth potential, then with the switching device open, due to the effect of the resistor means, at the load connection a defined, if also low, electrical voltage is present in relation to the earth potential, which can be processed in the processing device and in particular interpreted as low-level. With the switching device closed, however, subject to the connected load functioning correctly and correct operation of the switching device, it can be considered that at the load connection the supply potential provided at the supply connection is present, which is provided via the monitoring connection to the processing device and interpreted there as high-level.

If the load, by way of example, experiences an electrical interruption as a result of a fault, then independently of the switch position of the switching device on the monitoring connection of the processing device the supply potential is continuously present. Without a load connected, at the load connection and thus also at the monitoring connection the supply potential is continuously present. If, on the other hand, the switching device experiences a malfunction, this similarly leads to unexpected signal levels at the load connection. As an example, a switching device, which no longer opens as a result of a fault, independently of the switching signal provided to the switching device, leads to a permanent provision of a high level to the processing device. A switching device, which no longer closes as a result of a fault, independently of the switching signal provided to the switching device, leads to a permanent provision of a low level to the processing device.

The monitoring input can, as an example, be configured as a digital input, for determining a presence of a predefinable low-level or a predefinable high-level at the supply connection.

Particularly preferably, in the electrical connecting line between the supply connection and the monitoring connection of the processing device an electronic comparator circuit, in particular configured as a Schmitt trigger, is arranged, the switch-on threshold and switch-off threshold of which are different, wherein the voltage difference between the switch-on threshold and the switch-off threshold is referred to as switching hysteresis. In this way, from the analogue input signal, tapped on the load connection, a clear switching state can be gleaned.

Advantageous further developments of the invention are the subject matter of the dependent claims.

It is preferably provided that the processing device is configured for a determination of a diagnostic configuration on the basis of signal levels of the at least one load connection monitored and for a comparison of the diagnostic configuration with a stored load configuration and for an activation of the at least one electrical switching device for opening the electrical connection between the supply connection and the at least one load connection in the event of deviations between diagnostic configuration and load configuration. The processing device is thus provided so that from the analogue input signal, tapped on the load connection, it can determine information on the state of the switching device and the load, also referred to as a diagnostic configuration. The processing device can also be configured to compare the diagnostic configuration with a stored load configuration and in the event of a deviation between diagnostic configuration and load configuration to immediately open the associated switching device, in order in this way to bring about a safe state for the load.

In an alternative embodiment the processing device is configured to compare the diagnostic configuration with a stored load configuration and in the event of a deviation between diagnostic configuration and load configuration to transmit an error signal to a safety controller, which then takes a decision on any disconnection of the load to be carried out and to this end sends the processing device a corresponding disconnection signal, so that the processing device then opens the associated switching device, in order to bring about a safe state for the load.

As a function of a safety level to be taken as a basis for the respective load it can be provided that an electrical supply to the load takes place by means of the connection in series of a plurality of switching devices, so that even in the event of a defect in one of the switching devices a reliable disconnection of the load is still ensured.

In a further development of the invention a plurality of electrical switching devices are provided, which in each case are configured to provide electrical power to respectively associated loads and which in each case are arranged between the supply connection and a respective load connection and are configured for an opening or a closing of the respective electrical connection between the supply connection and the respective load connection as a function of switching signals of the at least one processing device, wherein the at least one processing device is electrically connected to the respective load connections and configured to monitor signal levels at the respective load connections. Thus, the control device can reliably activate a number of electrical loads and monitor the functioning of the switching devices and the load in a simple manner.

It is expedient if the processing device is configured for a determination of a diagnostic configuration based on signal levels of the respectively monitored load connections and for a comparison of the diagnostic configuration with a stored load configuration and for an activation of the electrical switching devices for opening the electrical connections between the supply connection and the respective load connection in the event of deviations between diagnostic configuration and load configuration. The determination of a diagnostic configuration for a number of electrical loads allows a rapid comparison of the signal levels present on the load connections monitored with an expectation. This expectation is based, by way of example, on the switching signals, provided by the processing device for activation of the individual switching devices. Alternatively, this expectation can also be expressed from the outside, in particular in the course of a configuration and/or parameterisation of the processing device. Preferably, a linking of the configuration and/or parameterisation with the switching signals currently supplied to the switching devices is provided for, to determine the expectation, which can be intermediately stored as the load configuration in the processing device, until the comparison with the diagnostic configuration is carried out. The processing device can in particular be designed to carry out the comparison of the diagnostic configuration with the load configuration on the basis of at least one predefinable comparison criterion. Here the comparison criterion defines a maximum permitted deviation between diagnostic configuration and load configuration and an activation of the electrical switching devices in an open state is carried out by the processing device if the comparison criterion is not met.

In an alternative embodiment the processing device is configured to compare the diagnostic configuration based on observation of a plurality of load connections with a stored load configuration and in the event of a deviation between diagnostic configuration and load configuration to transmit an error signal to a safety controller, which then takes a decision on any disconnection of the load to be carried out and to this end sends the processing device a corresponding disconnection signal, so that the processing device then opens the associated switching device, in order to bring about a safe state for the load.

In a further development of the invention it is provided that each electrical switching device is associated with its own processing device. It is preferably provided that the electrical switching device together with the resistor means and the processing device form a single module that is economical to manufacture, with multiple uses within the control device, wherein an activation of the multiplicity of modules is preferably provided for via a common controller. As an example, in the event of the individual processing devices converting the analogue input signal tapped on the load connection into a digital signal and passing this on to the common controller, and that in the common controller the determination of the load configuration and the comparison with the diagnostic configuration generated from the digital signal takes place in the individual processing devices.

In a further form of the invention, it is provided that the resistor means is configured as a safety resistor with a resistance that does not change over time and/or that the electrical switching device is configured as a field effect transistor, preferably as a p-channel MOSFET, in particular as an n-channel MOSFET. The resistor means can in particular be configured as a MELF (Metal Electrode Leadless Faces) resistor, and therefore as a surface mounted device (SMD) with a cylindrical shape, in which the circular faces form the electrical contacts. A characteristic of MELF resistors is that they have a precisely defined behaviour in the event of a fault, because due to their structure their resistance does not change over time or at all events they cannot go high-impedance. The use of field effect transistors allows a change in the switching state of the respective switching device with a low energy flow, so that, by way of example, a direct activation of the switching devices by a microprocessor or microcontroller can be guaranteed. The use of a field effect transistor configured as an n-channel MOSFET, because of the lower internal resistance compared to a p-channel MOSFET, also lowers the losses in the switching device during operation of the load.

It is preferably provided that the processing device is configured for a processing of electrical signals of the input interface, containing a load configuration in a first and in a second encoding. The load configuration forms the comparative value for the in each case currently determined diagnostic configuration and thus represents an essential component for the functioning of the control device. This applies in particular in the event that the load associated with the at least one load connection is operated in a safety-oriented manner. In this case it is necessary to be able to provide the load configuration without errors to the processing device. In practice, this can take place in that the load configurations created by a user in a configuration system which, by way of example, can be operated as computer software on a computer connectable directly or indirectly with the processing device and which in particular comprises a graphical user interface, by associating loads with the respective processing device. It can also be provided that the user determines the association of the load to the respective processing device manually also and converts this load configuration according to a predefinable encoding into a character string, which in turn can be entered in the configuration system. Following this configuration, the load configuration generated automatically in the configuration system by the association performed and the load configuration generated manually by the user and for example entered as a character string in the configuration system are transmitted to the processing device, where a comparison of the two load configurations can be carried out. To be able to exclude transmission errors between the configuration system and the processing device, it can in particular be provided that the automatically created load configuration contains the manually created load configuration as a parameter set, so that the transmission of the two load configurations with identical content takes place with diverse redundancy, thus in two different encodings. The processing device is also configured so that only in the event of matching of the two load configurations can it output switching signals respectively to the associated switching devices for closing the switching devices. It is furthermore provided, prior to an actual putting into service of a device equipped with the control device, by way of example a processing machine or an industrial robot, to first perform a validation while taking particular precautionary measures, in the process of which it can similarly be checked if the safety-oriented manner of operation for the load associated with the respective load connections is guaranteed.

In a further form of the invention, it is provided that the processing device is configured for a processing of electrical signals of the input interface, containing a load group configuration in a first and in a second encoding, and for targeted disconnection of at least one load group if a deviation exists between a diagnostic configuration for the load group and the load group configuration determined for the load group. The intention here is that a load group represents a subset of all loads connected to the processing device, which as a group and in a uniform manner are to be disconnected from the processing device, where a deviation exists between the diagnostic configuration for the load group and the associated load group configuration. In this way, it can be provided that a number of loads, connected to the processing device, are subdivided into at least two, preferably more, groups and by way of example to disconnect just one of the groups, while operation of the other groups is maintained. An example of this is a processing machine with a first industrial robot for supplying workpieces, a cutting machine for processing the workpieces and a second industrial robot for removing workpieces, wherein all actuators of the two industrial robots and the cutting machine are in particular connected to a common processing device. Here, by way of example, the actuators of the first industrial robot form a first group of loads, the actuators of the second industrial robot form, by way of example, a second group of loads and the actuators of the cutting machine form, by way of example, a third group of loads.

In the event of a deviation between a load group configuration and a diagnostic configuration for the first group of loads it can be provided that this first group of loads, by way of example the actuators of the first industrial robot, is disconnected, while the two other groups of loads, in this example, therefore, the actuators of the cutting machine and of the second industrial robot, remain unaffected by this and continue to operate unhindered.

Since the load group configurations involve safety-related parameters, which by way of example are set by a user by combining individual loads to form groups in a configuration system, a safe transmission from the configuration system to the processing device is indispensable. To this end, as an example, in the same way as for transmission of the load configurations, for the load group configurations also a transmission with diverse redundancy with two different encodings can be provided for, so that the processing device by comparing the two differently-encoded load group configurations can first check for error-free transmission and then use the transmitted load group configuration for the processing with the diagnostic configuration.

It is advantageous if the processing device is configured for a free association of load connections and associated switching devices with the respective load groups as a function of at least one load group configuration. It is preferable if the processing device is configured as a microprocessor or microcontroller and has a number of output connections for providing switching signals and of input connections for receiving signal levels from the respectively associated load connections, wherein the processing device is configured so that adjacently arranged connection pairs, comprise the respective one output connection and one input connection, and can optionally be associated with the same or different load groups. Accordingly, loads can initially be connected in any manner to the processing device, which in particular for cabling of the load is an advantage, in order then via the configuration system and the configuration and parameterisation of the processing device linked to this, to establish the desired association of the loads with the groups and to check the functioning in the course of the validation.

The object of the invention is achieved according to a second aspect of the invention for an automation system. The automation system comprises a control device according to the invention and a higher-level controller, which is connected via a communications link with the control device and is configured to provide electrical signals to the input interface of the control device, and with at least one load, connected with at least one of the load connections of the control device, wherein the higher-level controller is configured for a provision of a load configuration, in particular a load group configuration, to the control device. The higher-level controller can in particular involve a programmable logic controller (PLC), not constructed in a safety-oriented manner and also not operated in a safety-oriented manner and which is configured for the coordination of sequences of a complex device, by way of example a processing machine. To be able to guarantee a safety-oriented method of operation for at least some actuators of the processing machine, the higher-level controller is connected via a communications link, by way of example a bus connection, with a control device, configured according to the invention. Accordingly, the processing device of the control device allows a safety-oriented operation in particular for those actuators of the processing machine, posing a potential risk. It is, for example, provided that a load configuration or load group configuration is created by means of one of the configuration systems associated with the controller and transmitted to the control device before putting the automation system into service, in particular using various encodings for achieving information transmission with diverse redundancy. Following a validation of the automation system, during which, while taking special precautionary measures, all functions, in particular the safety-oriented functions of the automation system, are checked, a normal operation for the automation system can then be carried out, in the process of which the controller determines movement instructions for the actuators of the processing machine and by way of example transmits these to the control device. In the control device, on the basis of movement instructions provided in the form of electrical signals to the input interface and the load configuration and one or more load group configurations that may be provided, an activation of the associated switching devices and a comparison with the respective currently determined diagnostic configuration is carried out, so that in the event of deviations a complete or partial disconnection of the automation system can be performed.

In an advantageous further development of the automation system, it is provided that the at least one load is associated with a plurality of the load connections. In this way loads can also be connected to the processing device which have an energy requirement that would overload a capacity of an individual load connection. Due to the free configurability of the load connections it is not necessary for the load connections provided for supplying the respective load to be arranged immediately adjacent to one another, so that in this way an advantageous degree of freedom for the electrical connection of the load with the processing device can be guaranteed.

The object of the invention is achieved according to a third aspect of the invention for a method for operating a control device according to the invention. In doing so, it is provided that the processing device compares with one another electrical signals arriving at the input interface, containing a load configuration, in particular a load group configuration, in a first and in a second encoding, and performs a storing of the load configuration, in particular of the load group configuration, where the two load configurations, in particular load group configurations, match and that the processing device performs a determination of a diagnostic configuration on the basis of signal levels of the respectively monitored load connections and a comparison of the diagnostic configuration with the stored load configuration and an activation of the electrical switching devices for opening the electrical connections between the supply connection and the respective load connection in the event of deviations between diagnostic configuration and load configuration.

BRIEF DESCRIPTION OF THE DRAWINGS

An advantageous embodiment of the invention is represented in the drawing. This shows as follows.

DETAILED DESCRIPTION

Figure 1:
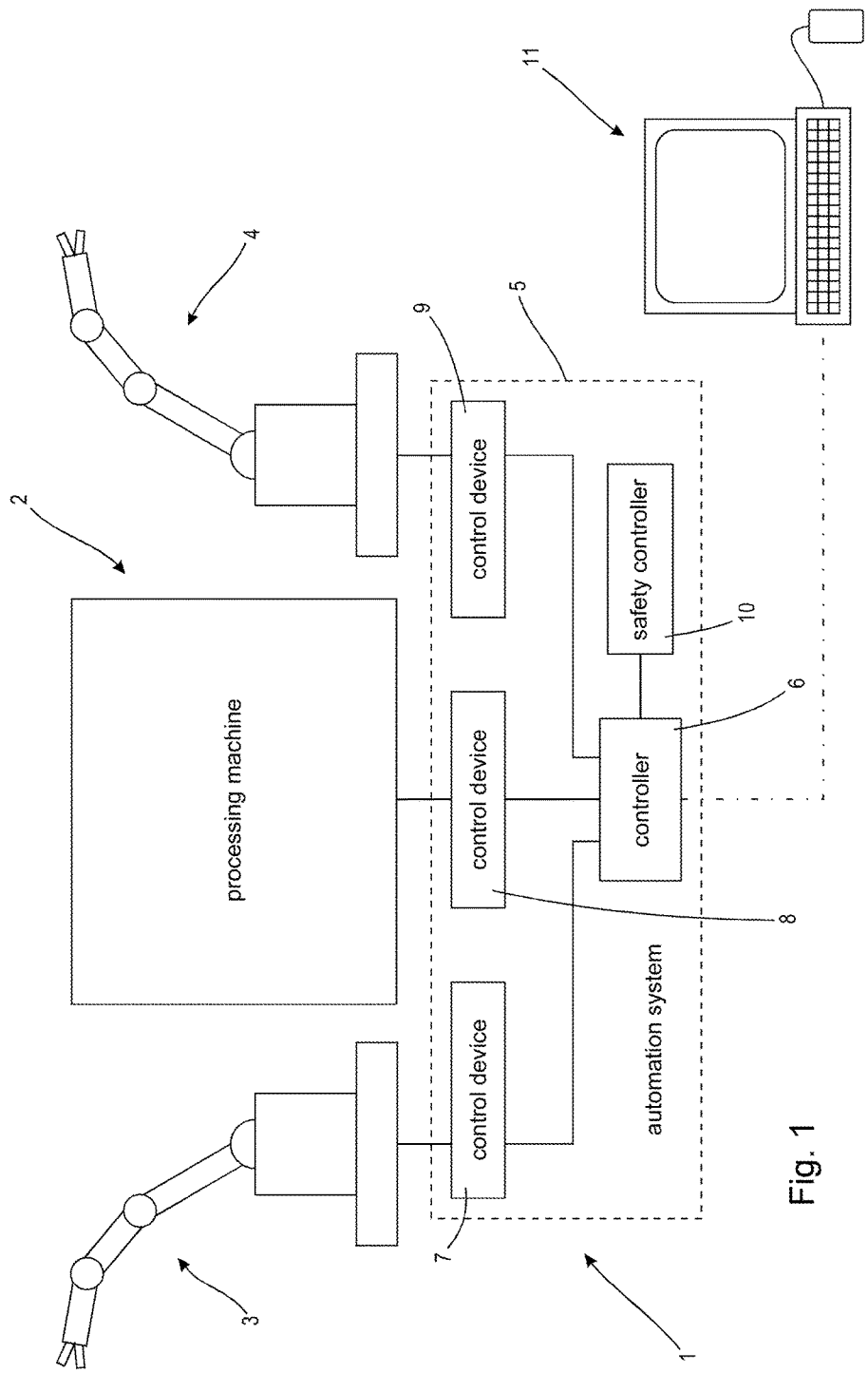
FIG. 1 a processing system, comprising as an example a processing machine with two associated industrial robots and an automation system for controlling the processing machine and the industrial robots, FIG. 2 a first embodiment of a control device, in which a processing device is configured for controlling a plurality of loads, FIG. 3 a second embodiment of a control device, in which each load is associated with a separate processing device, and FIG. 4 a schematic representation of the sequences in the control device.

A processing system 1 shown in FIG. 1 purely schematically and purely by way of example serves for the processing of workpieces not represented in more detail and comprises a processing machine 2 configured, as an example, as a milling machine, a first industrial robot 3, a second industrial robot 4 and an automation system 5. Here, the first industrial robot 3 is provided for supplying the workpieces not represented in more detail to the processing machine 2, while the second industrial robot 4 is provided for removing processed workpieces, similarly not represented, from the processing machine 2. The automation system 5 is provided for coordinated activation of the actuators not represented in more detail of the processing machine 2 and of the industrial robots 3 and 4, wherein the actuators can, purely as an example, involve pneumatic cylinders. Accordingly, the automation system 5 is configured to provide compressed air from a compressed air source (not shown) in a manner not represented in more detail to the individual actuators, and to this end the automation system 5 comprises a number of fluid valves, similarly not represented in more detail, in particular solenoid valves, which can be activated and deactivated by means of suitable switching signals.

The automation system 5 comprises, as an example, a higher-level controller 6 configured as a programmable logic controller (PLC), electrically connected to control devices 7, 8 and 9 and to a safety controller 10. Here the control devices 7, 8 and 9 are in each case provided for activation of a component of the processing system 1, thus of the processing machine 2, the industrial robots 3 and the industrial robot 4. Purely as an example, it can be provided that each of the control devices 7, 8 and 9 provides switching signals to fluid valves, integrated in a manner not represented in more detail into the processing machine 2, the industrial robot 3 and the industrial robot 4. The higher-level controller 6 coordinates the activities of the processing machine 2, the industrial robot 3 and the industrial robot 4, in particular on the basis of a sequential program, and provides the associated control devices 7, 8 and 9 with movement commands in the form of electrical input signals. The task of the safety controller 10 is to monitor the movements of the actuators of the processing machine 2, the industrial robot 3 and the industrial robot 4 and in the event of a deviation between an expected behaviour of the associated components and an actual behaviour of the associated components to perform a disconnection of the processing system 1 in the manner represented in more detail below, in order to transfer the processing system 1 or at least parts of the processing system 1 into a safe state.

The higher-level controller 6 can be temporarily connected to a computer 11, on which a configuration system not represented in more detail, in particular having a graphical user interface, is running. This configuration system can be used by a user similarly not represented in more detail to configure the automation system 5. By way of example, in the course of configuration of the automation system 5 it is defined which of the control devices 7, 8 and 9 of the processing machine 2, is associated with the first industrial robot 3 and the second industrial robot 4 and what the intended interrelationship between these components is if, by way of example, a safety-oriented action is necessary, to avoid danger to a user.

Figure 2:
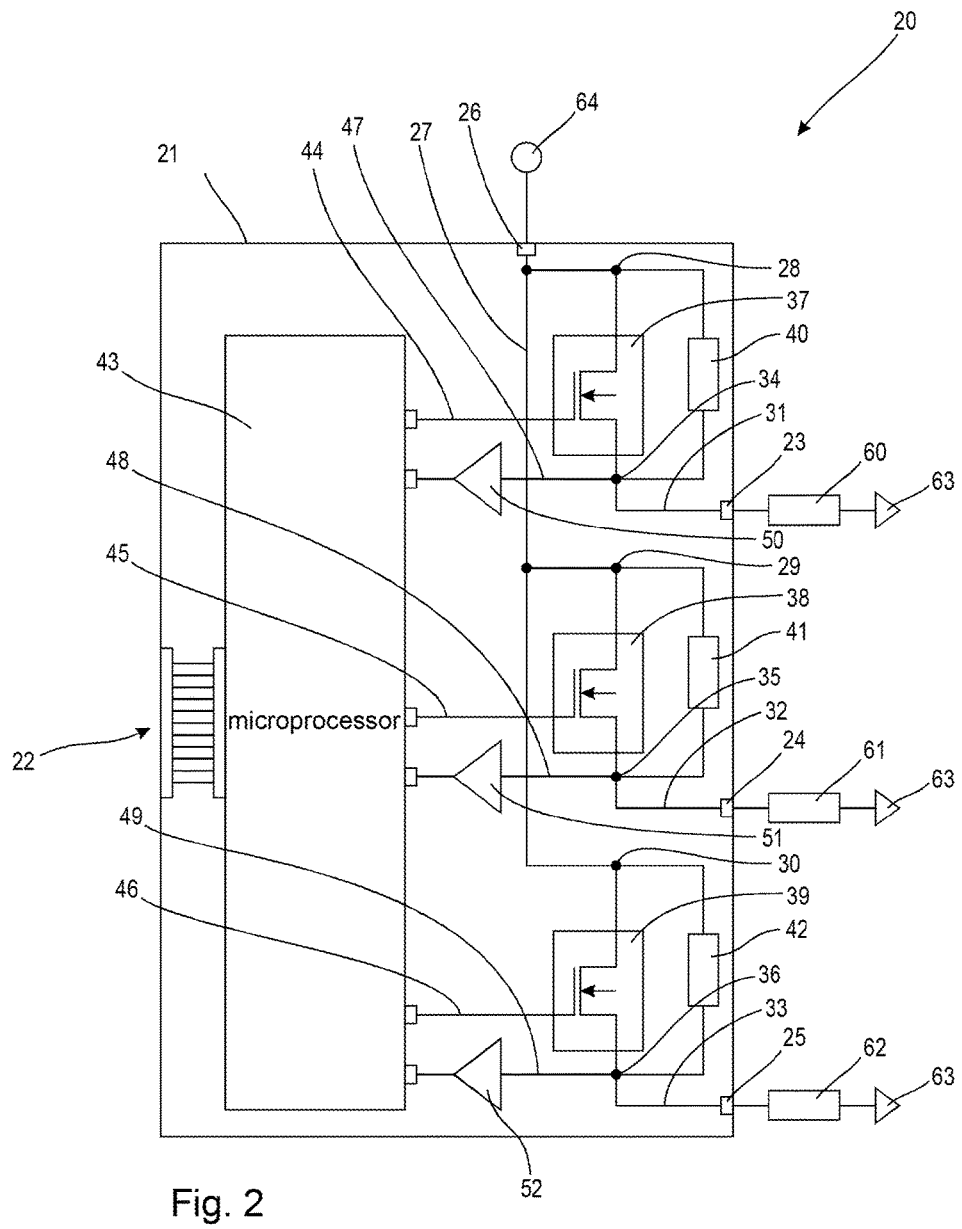

FIG. 2 shows a first embodiment of a control device 20, which can be used in the form of at least one of the control devices 7, 8 or 9 in the processing system 1 according to FIG. 1. The control device 20 is configured purely as an example as a functional module with a housing 21, on which a communications interface 22 serving as, amongst other things, an input interface, a plurality of load connections 23, 24 and 25 and a supply connection 26 are provided. As an example, to each of the load connections 23, 24, 25 a respective load 60, 61, 62 is connected. The loads 60, 61 and 62 are, by way of example, solenoid coils of solenoid valves not represented in more detail to influence the fluid flow for the components represented in FIG. 1 of the processing system 1. It is also provided that each of the loads 60, 61 and 62 is electrically connected with a connection not represented in more detail turned away from the load connection 23, 24, 25 with a reference potential, in particular with an earth potential 63.

The supply connection 26 is electrically connected to a voltage source 64, configured to provide an electrical voltage. From the supply connection 26 a supply line 27 extends through the control device 20, electrically connected with supply connections 28, 29, 30, wherein the supply connections 28, 29 and 30 are configured as electrical nodal points in the control device 20.

From the load connections 23, 24, 25, connecting lines 31, 32, 33 extend as far as load connections 34, 35, 36, which are configured as electrical nodal points in the control device 20.

Extending between the supply connections 28, 29, 30 and the load connections 34, 35, 36, in each case connected electrically in parallel, there is in each case a switching device 37, 38, 39 and in each case a resistor means 40, 41, 42. The switching devices 37, 38, 39 preferably involve field effect transistors. The resistor means 40, 41, 42 are configured as ohmic resistances, in particular as MELF resistors.

The control device 20 also comprises a processing device 43, which is for example configured as a microprocessor and which is electrically connected with the communications interface 22. The processing device 43 is also electrically connected via control lines 44, 45, 46 with the control connections (gates) not described in more detail of the switching devices 37, 38, 39. Thus, control signals provided by the processing device 43 via the control lines 44, 45, 46 can be used to influence the switching states of the respective switching devices 37, 38, 39. Furthermore, the processing device 43 is connected via sensor lines 47, 48, 49 respectively with the load connections 34, 35, 36, wherein each of the sensor lines 47, 48, 49 is in each case arranged as an electronic comparator circuit 50, 51, 52 configured as a Schmitt trigger, with the help of which from the analogue input signal, tapped on the respective load connection 34, 35, 36, a clearer signal level can be obtained which, by way of example, is provided as a low level or high level to the processing device 43.

A functioning of the control device 20 can, purely as an example, be described as follows: firstly, with the help of the computer 11 represented in FIG. 1 and a configuration system running thereon, a configuration of the processing system 1 or at least of the automation system 5 takes place. In the course of this configuration it can be defined to which load connections 23, 24, 25 which loads 60, 61, 62 are connected and if possibly a plurality of loads 60, 61, 62 are to form a load group 65, as shown in the schematic representation of FIG. 4.

Since the mapping of the loads 60, 61, 62 involves safety-related information, it can be provided that, from the mapping, which can take place in the configuration system by way of example on the basis of a graphical user interface, in an automated manner a first piece of mapping information, also referred to as a configuration, can be generated. It can also be provided that the mapping performed, by way of example using a suitable mapping table can be converted manually by a user into a second piece of mapping information which, by way of example, is entered as a character string or parameter set in the configuration. Upon completion of the configuration, the result of the configuration is transmitted with the configuration and the parameter set this contains from the computer 11 to the higher-level controller 6 and from there can be transmitted to the individual control devices 7, 8, 9.

Figure 4:
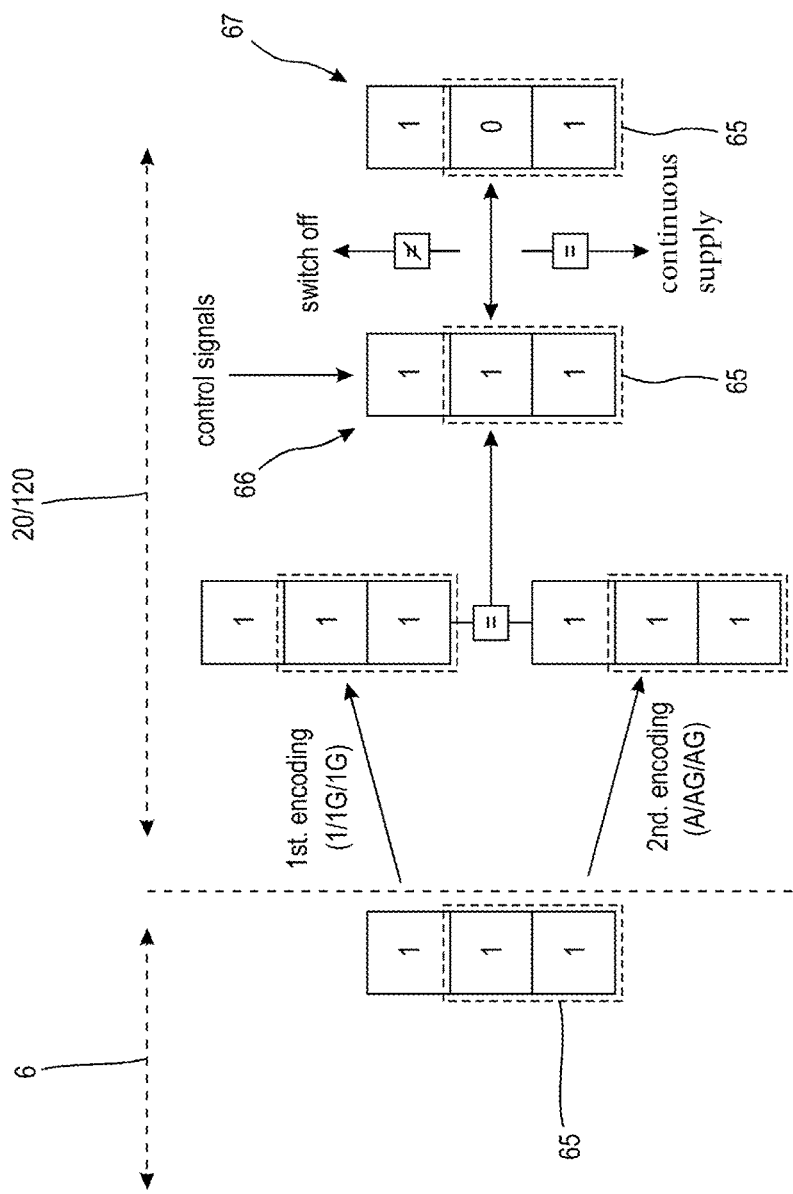

As an example, consistent with the representation of FIG. 2, with the mapping information, as represented in FIG. 4, it can be assumed that at each of the load connections 23, 24, 25 a load 60, 61, 62 is respectively connected, symbolised by the numbers 1 employed in each case in the starting information used by the computer 11. The different representation of the mapping information, by way of example in the form of a configuration and a parameter set contained in the configuration is symbolised in that the starting information of the computer 11 is transmitted in a first encoding and in a second encoding to the control device 20.

Two loads belonging to the load group 65 is symbolised purely as an example by the addition of "G" to the respective encoding, in practice a different representation may possibly be used for this.

As an example, when the configuration and the parameter set contained therein reached the control device 20 which for example is equivalent to the control device 7 a comparison of the first mapping information with the second mapping information takes place, wherein a necessary condition for a putting into operation of the control device 20 is a correspondence of both pieces of mapping information. Where there is such correspondence, the processing device 43 of the control device 20 can convert the control signals arriving via the communications interface 22 into switching signals for the respectively associated switching devices 37, 38, 39, to bring about the desired activation of the associated loads 60, 61, 62. The processing device 43 also monitors the signal levels at the load connections 34, 35, 36 and generates from these signal levels a diagnostic configuration 67, which is then compared with the load configuration 66, wherein the load configuration 66 is preferably updated in each case as a function of the switching signals for the switching devices 37, 38, 39 to be activated.

If the diagnostic configuration 67 corresponds with the load configuration 66 an energy supply of the switching devices 37, 38 and 39 activated at the respective point in time is maintained, so that the associated loads 60, 61, 62 can also continue to be supplied with energy. If, on the other hand, there is no correspondence between the diagnostic configuration 67 and the load configuration 66, then it can optionally be provided that the processing device 43 immediately performs the activation of the switching devices 37, 38, 39 such that all connected loads 60, 61, 62 are disconnected. Alternatively, in the case shown in FIG. 4, in which there is a deviation between the diagnostic configuration for the load group 65 and the load group configuration, it can be provided that the processing device 43 switches off only the loads belonging to the load group 65, while the loads not belonging to the load group 65 continue to be operated. Alternatively, in this case, it can also be provided that the processing device 43 transmits a corresponding signal via the communications interface 22 to the safety controller 10 and there a decision is made on disconnection or continued operation of the connected load, in particular the load group 65, which is then transmitted back to the control device 20, in order then to perform the disconnection of the load group 65 or all loads.

Figure 3:
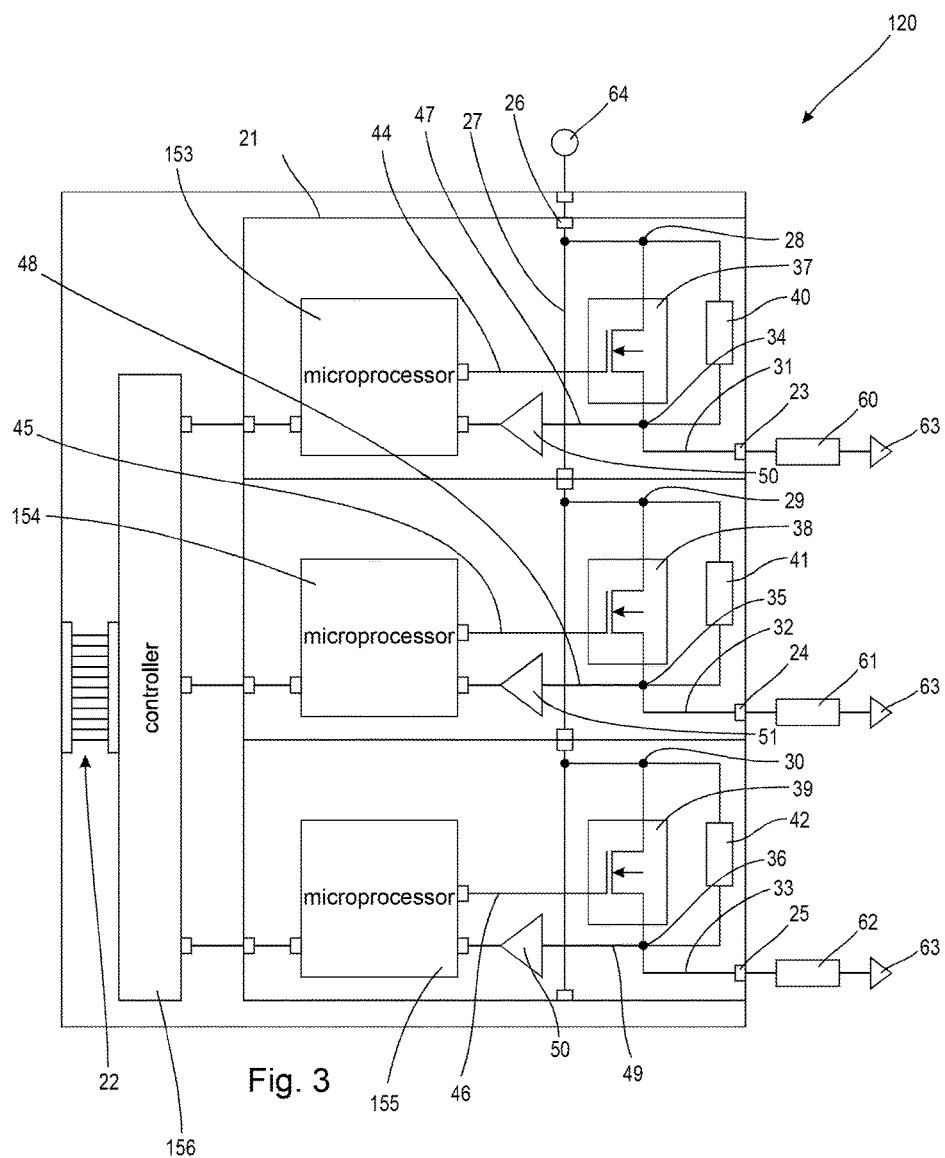

The control device 120 represented in FIG. 3 differs from the control device 20 in that each of the switching devices 37, 38, 39 is associated with its own processing device 153, 154, 155, wherein a functioning of these respective processing devices 153, 154, 155 is substantially identical to the functioning of the processing device 43.

For coordination of the processing devices 153, 154 and 155 in the control device 120 a controller 156 is provided, which in the manner of a bus node distributes the signals arriving at the communications interface 22 to the individual processing devices 153, 154, 155 and provides signals of the processing devices 153, 154, 155 to the communications interface 22.

What is claimed is:

1. A control device for activation of a component of a processing system, the control device comprising:
   a supply connection;
   a load connection;
   at least one electrical switching device arranged between the supply connection and the load connection, the electrical switching device being configured to provide electrical power to an associated load;
   an electrical resistor arranged between the supply connection and the load connection parallel to the switching device;
   an input interface; and
   a microprocessor electrically connected with each of the input interface, the at least one electrical switching device and the load connection, the microprocessor processing electrical signals received from the input interface and generating switching signals,
   wherein the at least one electrical switching device is switchable between an open position, for opening an electrical connection between the supply connection and the load connection, and a closed position, for closing of the electrical connection between the supply connection and the load connection, depending on the switching signals generated by the microprocessor, and
   wherein the microprocessor is configured to monitor signal levels at the load connection; and
   wherein the electrical resistor forms a voltage divider with the load when the switching device is in the open position for allowing a monitoring of the load connection independently of whether the switching device is in the open position or in the closed position.

2. The control device according to claim 1, wherein the microprocessor is configured for a determination of a diagnostic configuration which is based on the monitoring of the signal levels of the at least one load connection and the microprocessor is configured for a comparison of the diagnostic configuration with a stored load configuration and also is configured for an activation of the at least one electrical switching device for opening the electrical connection between the supply connection and the at least one load connection in the event of deviations between the diagnostic configuration and the stored load configuration.

3. The control device according to claim 1, wherein a plurality of electrical switching devices are provided, each of which is configured to provide electrical power to a respectively associated load and each of which is arranged between the supply connection and a respective load connection and each of which is configured for an opening or a closing of the respective electrical connection between the supply connection and the respective load connection as a function of switching signals of the microprocessor, wherein the microprocessor is electrically connected to the respective load connections and is configured to monitor signal levels at the respective load connections.

4. The control device according to claim 3, wherein each electrical switching device is associated with its own processing device.

5. The control device according to claim 1, wherein the resistor means is configured as a safety resistor with resistance that does not change over time and/or wherein the electrical switching device is configured as a field effect transistor.

6. The control device according to claim 1, wherein the microprocessor is configured for a processing of electrical signals of the input interface, wherein the electrical signals of the input interface contain a load configuration which is predefined in a first encoding and in a second encoding.

7. A control device for activation of a component of a processing system, the control device comprising:
   a supply connection;
   a load connection;
   at least one electrical switching device arranged between the supply connection and the load connection, the electrical switching device being configured to provide electrical power to an associated load;
   an electrical resistor arranged between the supply connection and the load connection parallel to the switching device;
   an input interface; and
   a microprocessor electrically connected with each of the input interface, the at least one electrical switching device and the load connection, the microprocessor processing electrical signals received from the input interface and generating switching signals,
   wherein the at least one electrical switching device is switchable between an open position, for opening an electrical connection between the supply connection and the load connection, and a closed position, for closing of the electrical connection between the supply connection and the load connection, depending on the switching signals generated by the microprocessor, and
   wherein the microprocessor is configured to monitor signal levels at the load connection, and
   wherein the electrical resistor forms a voltage divider with the load when the switching device is in the open position for allowing a monitoring of the load connection independently of whether the switching device is in the open position or in the closed position, and
   wherein the microprocessor is configured for a processing of electrical signals of the input interface, wherein the electrical signals of the input interface contain a load group configuration which is predefined in a first encoding and in a second encoding, and wherein the microprocessor is configured for a disconnection of at least one load group if a deviation exists between a diagnostic configuration for the load group and the load group configuration determined for the load group.

8. A control device for activation of a component of a processing system, the control device comprising:
   a supply connection;
   a load connection;
   at least one electrical switching device arranged between the supply connection and the load connection, the electrical switching device being configured to provide electrical power to an associated load;
   an electrical resistor arranged between the supply connection and the load connection parallel to the switching device;
   an input interface; and
   a microprocessor electrically connected with each of the input interface, the at least one electrical switching device and the load connection, the microprocessor processing electrical signals received from the input interface and generating switching signals,
   wherein the at least one electrical switching device is switchable between an open position, for opening an electrical connection between the supply connection and the load connection, and a closed position, for closing of the electrical connection between the supply connection and the load connection, depending on the switching signals generated by the microprocessor, and wherein the microprocessor is configured to monitor signal levels at the load connection, and wherein the electrical resistor forms a voltage divider with the load when the switching device is in the open position for allowing a monitoring of the load connection independently of whether the switching device is in the open position or in the closed position, and wherein the microprocessor is configured for a free association of load connections and associated switching devices to respective load groups as a function of at least one load group configuration.

9. An automation system with a control device and a controller, the control device comprising:
   a supply connection;
   a load connection;
   at least one electrical switching device arranged between the supply connection and the load connection, the electrical switching device being which is configured to provide electrical power to an associated load;
   an electrical resistor arranged between the supply connection and the load connection parallel to the switching device;
   an input interface; and
   a microprocessor electrically connected with each of the input interface, the at least one electrical switching device and the load connection, the microprocessor processing electrical signals received from the input interface and generating switching signals,
   wherein the at least one electrical switching device is switchable between an open position, for opening an electrical connection between the supply connection and the load connection, and a closed position, for closing of the electrical connection between the supply connection and the load connection, depending on the switching signals generated by the microprocessor, and
   wherein the microprocessor is configured to monitor signal levels at the load connection, and
   wherein the electrical resistor forms a voltage divider with the load when the switching device is in the open position for allowing a monitoring of the load connection independently of whether the switching device is in the open position or in the closed position, and
   wherein the controller is connected via a communications link with the control device and is configured to provide electrical signals to the input interface of the control device and with at least one load, connected with at least one of the load connections of the control device, wherein the controller is configured for a provision of a load configuration to the control device.

10. The automation system according to claim 9, wherein the at least one load is connected with a plurality of the load connections.

11. A method for operating a control device, the control device comprising:
   a supply connection;
   a load connection;
   at least one electrical switching device arranged between the supply connection and the load connection, the electrical switching device being configured to provide electrical power to an associated load;
   an electrical resistor arranged between the supply connection and the load connection parallel to the switching device;
   an input interface; and
   a microprocessor electrically connected with each of the input interface, the at least one electrical switching device and the load connection, the microprocessor processing electrical signals received from the input interface and generating switching signals,
   wherein the at least one electrical switching device is switchable between an open position, for opening an electrical connection between the supply connection and the load connection, and a closed position, for closing of the electrical connection between the supply connection and the load connection, depending on the switching signals generated by the microprocessor, and
   wherein the microprocessor is configured to monitor signal levels at the load connection, and
   wherein the electrical resistor forms a voltage divider with the load when the switching device is in the open position for allowing a monitoring of the load connection independently of whether the switching device is in the open position or in the closed position, and
   wherein the microprocessor is configured to compare at least two electrical signals arriving at the input interface and containing a load configuration which is predefined in a first encoding and in a second encoding and wherein the microprocessor performs a storing of the load configuration if the two load configurations contained in the at least two electrical signals match and wherein the microprocessor performs a determination of a diagnostic configuration on a basis of signal levels of respectively monitored load connections and a comparison of the diagnostic configuration with the stored load configuration and also performs an activation of the electrical switching devices for opening the electrical connections between the supply connection and the respective load connection in the event of deviations between diagnostic configuration and load configuration.

* * * * *